United States Patent [19]
Sano

[11] Patent Number: 5,296,751
[45] Date of Patent: Mar. 22, 1994

[54] SAMPLE-AND-HOLD CIRCUIT
[75] Inventor: Yoshiki Sano, Kashihara, Japan
[73] Assignee: Sharp Kabushiki Kaisha, Osaka, Japan
[21] Appl. No.: 855,677
[22] Filed: Mar. 23, 1992
[30] Foreign Application Priority Data
  Mar. 25, 1991 [JP] Japan .................. 3-60200
[51] Int. Cl.$^5$ .............................................. G11C 27/02
[52] U.S. Cl. .................... 307/353; 307/359; 328/151
[58] Field of Search .................. 307/353, 359; 328/151
[56] References Cited
  U.S. PATENT DOCUMENTS
  5,162,670 11/1992 Itakura et al. ..................... 307/353
  FOREIGN PATENT DOCUMENTS
  61-9900 1/1986 Japan .

OTHER PUBLICATIONS
"A Multiple-Input OTA Circuit for Neural Networks" by R. Reed et al, IEEE Transactions on Circuits and Systems 36(1989) May, No. 5, pp. 767-769.
"GaAs Switched-Capacitor Circuits for High-Speed Signal Processing" by L. Larson et al, IEEE Journal of Solid-State Circuits SC-22 (1987) Dec., No. 6, pp. 971-981.
Abstract of Japanese Application No. 57-162185.

Primary Examiner—John Zazworsky

[57] ABSTRACT

A sample-and-hold circuit includes two capacitors connected to an input signal line through respective analog switches for holding an input signal. An amplifier circuit of the sample-and-hold circuit includes two input terminals for receiving voltages held in the respective two capacitors and for amplifying the received voltages. The amplifier circuit alternately amplifies the voltages received through the two input terminals.

9 Claims, 7 Drawing Sheets

SAMPLE-AND-HOLD CIRCUIT

BACKGROUND OF THE INVENTION

1. Field of the Invention

The present invention relates to a sample-and-hold circuit.

2. Description of the Related Art

An example of a known sample-and-hold circuit is shown in FIG. 5. This circuit is used for an active-matrix liquid crystal display device, for example. As shown, an analog signal such as a video signal to be sampled and held is entered from an input signal line 25. Elements 13 and 17 are capacitors (including stray capacitance of the circuit), which serve to hold the voltge of the analog signal Y. Each one end of the capacitors is connected to the ground. The other ends of the capacitors are connected so that the analog signal Y can enter the capacitors through analog switches 12, 16, respectively. The voltages held in the capacitors 13, 17 are inputted to a non-inverting input of an operational amplifier 19 through analog switches 14, 18, respectively. A capacitor 15 and an analog switch constituted by an MOS transistor 21 are connected between the non-inverting input terminal of the operational amplifier 19 and the ground. Element 22 is a MOS transistor connected between an output of a buffer 20 and the ground. A control signal R is inputted to the gates of the transistors 21, 22 through a signal line 10.

The operational amplifier 19 is composed of a differential amplifier as shown in FIG. 6. Herein, N41 and N42 each denote an n-channel MOS transistor. The MOS transistor N41 has a gate connected to the non-inverting input of the operational amplifier 19 and the MOS transistor N42 has a gate connected to the inverting input of the operational amplifier 19. The transistor N41 is connected between an n-channel MOS transistor N43 connected to the ground and a p-channel MOS transistor P41 connected to a power supply VDD. The transistor N42 is connected between the transistor N43 and a p-channel MOS transistor P42 connected to the power supply VDD. A contact between the transistors N42 and P42 serves as an output of this operational amplifier.

When the input signal Y is sampled and held at predetermined periods, the sample-and-hold circuit arranged as described above receives control signals R and S1 to S4 as shown in the timing chart of FIG. 7. In response to the control signals, the circuit functions as follows. When a high level control signal S1 is inputted to the circuit at a timing point T1, the analog switch 12 is switched on so that the signal Y is applied to the capacitor 13. Hence, the capacitor 13 is charged. Then, the signal S1 falls to the low level and the analog switch 12 is switched off, and the capacitor 13 holds the voltage D1 of the signal Y immediately before the fall. Next, the high level control signal R is supplied to the circuit, whereby the transistors 21, 22 turn on so that the output of the buffer 20 falls to the ground level. Hence, the capacitor 15 is discharged. When the control signal S3 rises to the high level, the analog switch 14 is switched on, so that the charges of the capacitor 13 are moved to the capacitor 15. As a result, the voltage at the terminals of the capacitors 13 and 15 is made to be a value D1' defined depending on a capacitance ratio of the two capacitors. This voltage is outputted through the operational amplifier 19 and the buffer 20.

When a high level control signal S2 is supplied to the circuit at a timing point T2, the analog switch 16 is switched on so that the signal Y is applied to the capacitor 17. Hence, the capacitor 17 is charged with the signal Y. Thereafter, when the signal S2 falls to the low level and the analog switch 16 is switched off, the capacitor 17 holds the voltage D2 of the signal Y immediately before the fall. Then, the high level control signal R is supplied to the circuit. In response to the high level signal R, the transistors 21, 22 are switched on so that the output of the buffer 20 becomes the ground level and the capacitor 15 is discharged. When the control signal S4 rises to the high level, the analog switch 18 is switched on so that the charges of the capacitor 17 are moved to the capacitor 15. As a result, the voltage at the terminals of the capacitors 17 and 15 is made to be a value D2' defined depending on a capacitance ratio of the two capacitors. This voltage is outputted through the operational amplifier 19 and the buffer 20. By alternately switching on the analog switches 12 and 16, the voltages D3, D4, . . . of the signal Y are sampled and held in the capacitors 13, 17, and 15. Then, the voltages D3', D4', . . . corresponding to the voltages D3, D4, . . . are outputted from the circuit.

The known sample and hold circuit arranged as described above serves to move part of the charges of the capacitors 13, 17 to the capacitor 15. Therefore, the voltages (D1, D2, . . .) of the sampled signal Y are attenuated. For example, assuming that the charges of the capacitor 13 is denoted as Q0 and the electrostatic capacitance of the capacitor 13 is denoted as C1, the voltage V0 at the terminal of the capacitor 13 is defined by the following expression.

$$V0 = Q0/C1$$

When the analog switch 14 is switched on while keeping the charges of the capacitor 13 at Q0, since the capacitors 13 and 15 are connected in parallel, the voltage V1 at the both terminals of the capacitors is defined by the following expression.

$$V1 = Q0/(C1+C2)$$

wherein C2 denotes an electrostatic capacitance of the capacitor 15. As is apparent from the above expression, $V1 < V0$ is given. Hence, the voltage inputted to the operational amplifier is lower than the voltage held in the capacitor 13. This holds for the capacitor 17. That is to say, when the analog switch 18 is switched on and the capacitor 15 becomes connected in parallel to the capacitor 17, the voltaage drops. Hence, the voltage inputted to the operational amplifier is lower than the voltage held in the capacitor 17.

SUMMARY OF THE INVENTION

It is therefore an object of the present invention to provide a sample-and-hold circuit having a simple circuit configuration and which is capable of supplying the sampled voltage without any attenuation.

In carrying out the object, the sample-and-hold circuit according to the invention includes two capacitors connected to an input signal line through their respective analog switches for holding an input signal voltage and an amplifier circuit having two input terminals for receiving voltages held in the two capacitors respectively for amplifying the received voltages, the amplifier circuit alternately amplifying the voltages received through the two input terminals.

The sample-and-hold circuit of the invention is arranged so that the voltage of the capacitor holding the sampled signal voltage is directly inputted to the operational amplifier. Hence, unlike the foregoing known circuit, this circuit does not need to move charges held in the capacitor to the other capacitor. As a result, this circuit enables to supply the sampled signal voltage without any attenuation. This results in reduction of the number of capacitors and elimination of the two analog switches and the MOS transistors. The circuit has simple circuit configuration, which leads to reduction of the overall circuit in size, cost and power consumption. In a case where the circuit is integrated on a semiconductor chip, the required area on the chip can be reduced.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

Further objects and advantages of the present invention will be apparent from the following description, reference being had to the accompanying drawings which are given by way of illustration only and thus are not limitative of the present invention and wherein.

DESCRIPTION OF THE PREFERRED EMBODIMENTS

Figure 1:
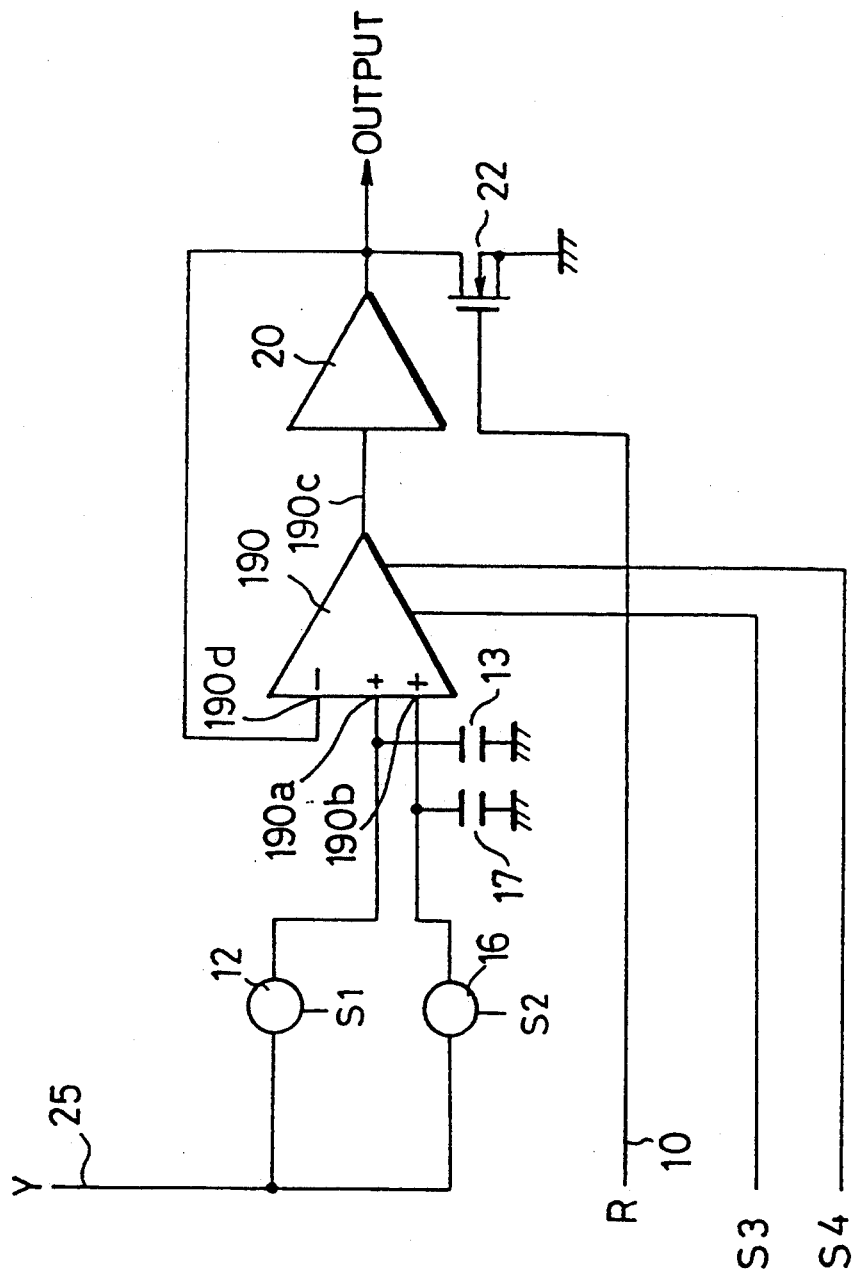
FIG. 1 is a circuit diagram of a sample-and-hold circuit according to an embodiment of the present invention.
Figure 5:
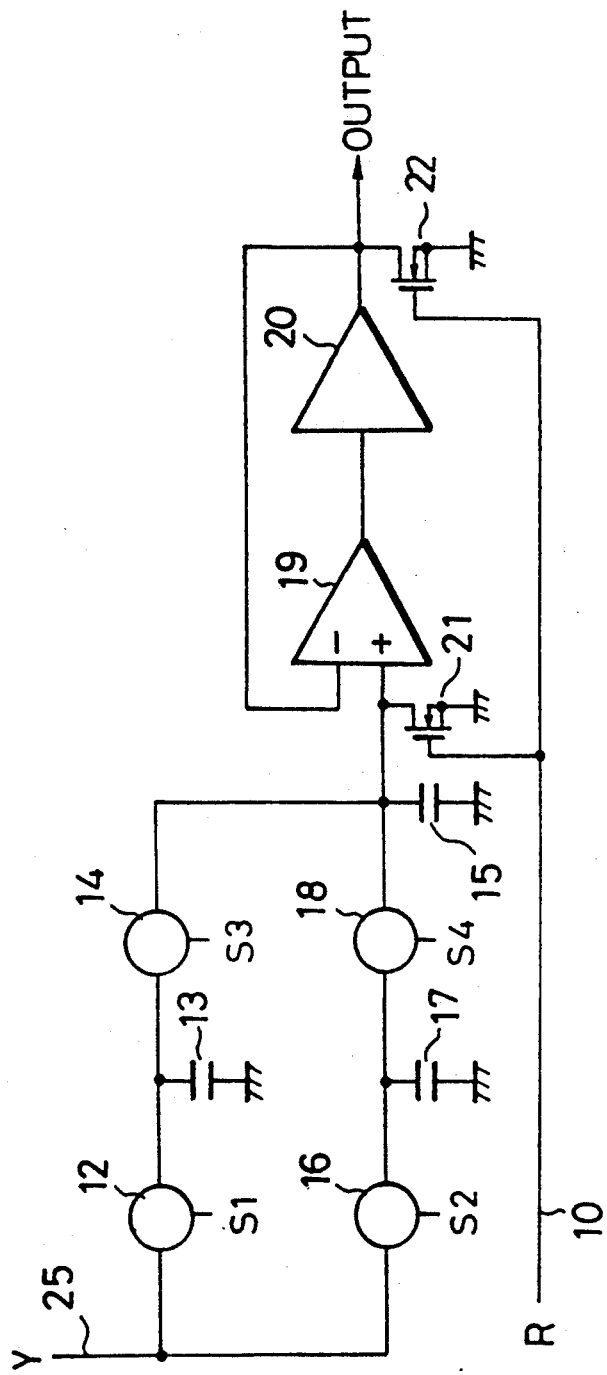
FIG. 5 is a circuit diagram of a conventional sample-and-hold circuit.
Figure 6:
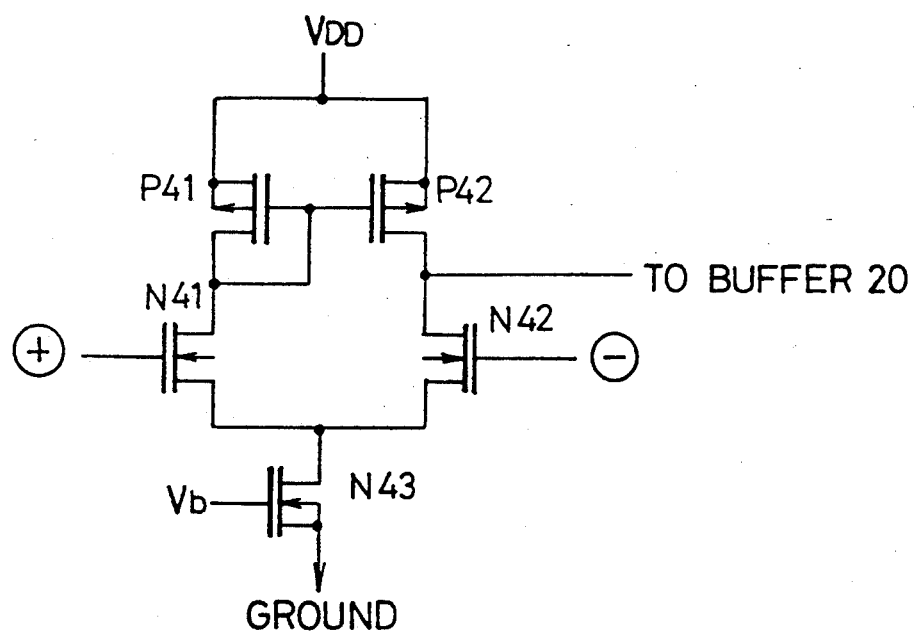
FIG. 6 is a circuit diagram showing a detailed arrangement of an operational amplifier included in the sample-and-hold circuit of FIG. 5.
Figure 7:
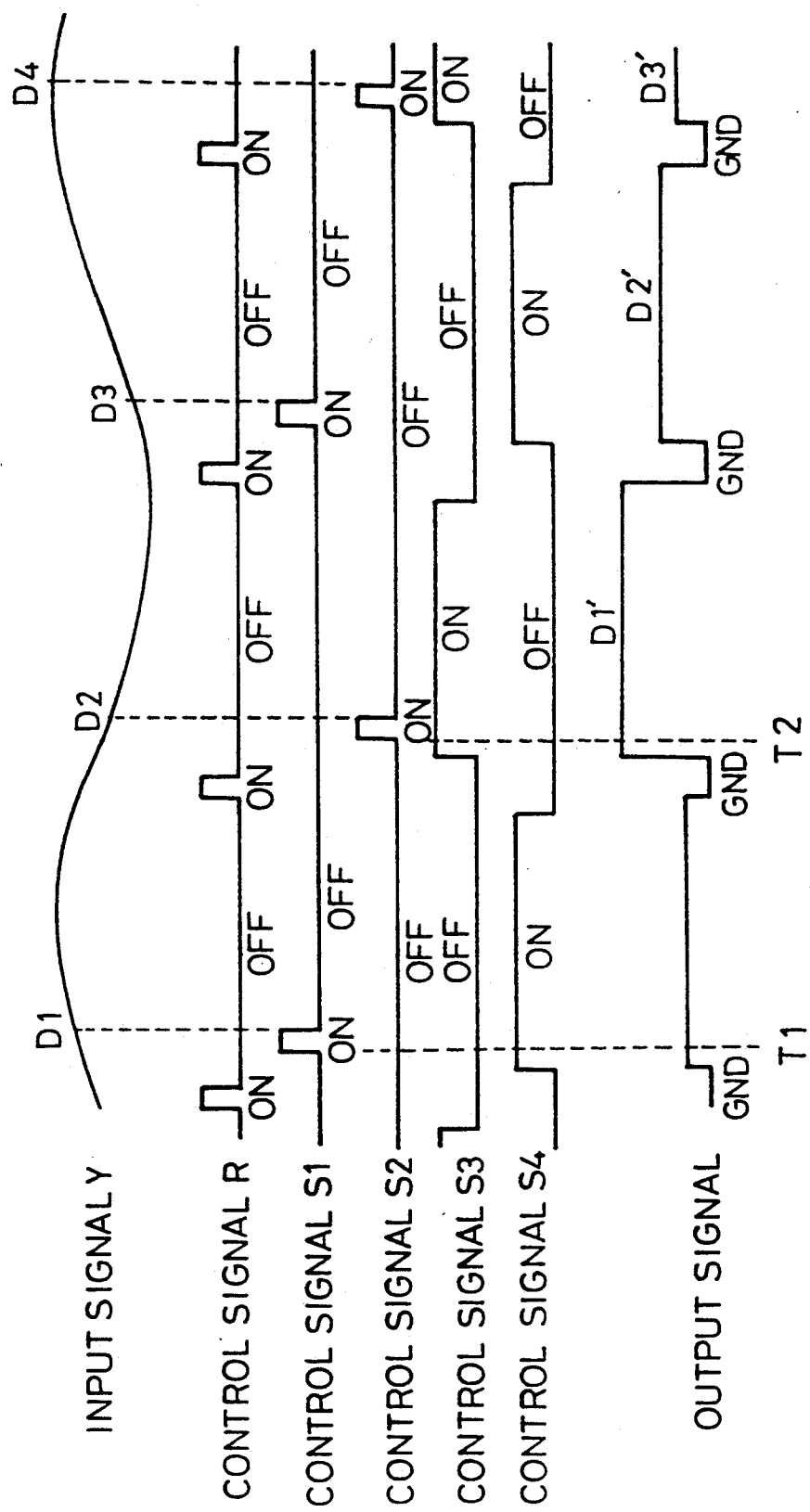
FIG. 7 is a timing chart for explaining the function of the sample-and-hold circuit of FIG. 5.

Hereinafter, the description will be directed to an embodiment of the present invention. FIG. 1 is a circuit diagram of a sample-and-hold circuit according to an embodiment of the invention. This circuit is used in an active-matrix liquid crystal display device, for example. As shown, the components having the same functions as those shown in FIG. 5 have the same reference numbers. The capacitors 13, 17 (including the stray of the circuit) serve to hold the voltage of the analog signal Y. Each one end capacitance of the capacitors 13, 17 is connected to the input signal line 25 through the analog switches 12, 16, respectively. The other terminals are connected to the ground.

An operational amplifier 190 has an output terminal 190c connected to the input of the buffer 20. The output of the buffer 20 is connected to an inverting input terminal 190d of the operational amplifier 190. The operational amplifier 190 has two non-inverting input terminals 190a, 190b. The input terminal 190a is connected to one terminal of the capacitor 13 and the input terminal 190b is connected to one terminal of the capacitor 17. The operational amplifier 190 has a control terminal for receiving the control signals S3 and S4. Element 22 is an MOS transistor connected between the output of the buffer 20 and the ground. The MOS transistor functions as an analog switch. The control signal R is applied to the gate of the MOS transistor 22.

Figure 2:
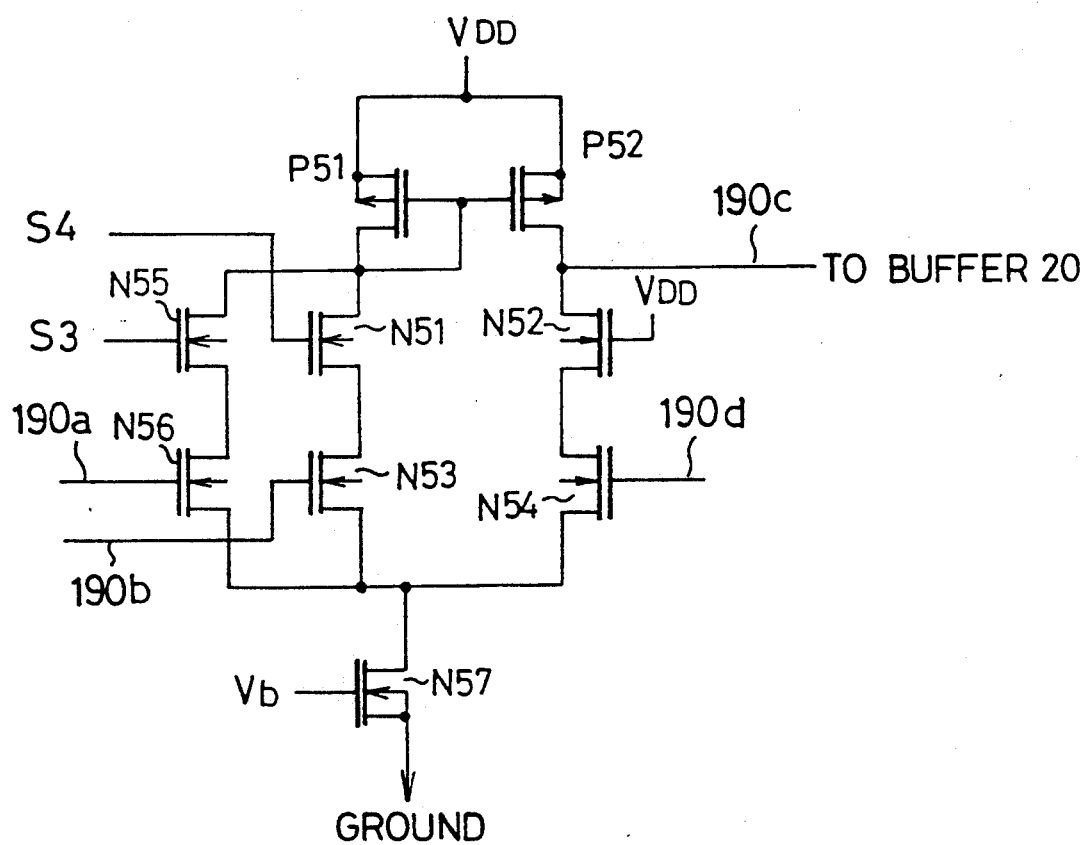
FIG. 2 is a circuit diagram showing a detailed arrangement of an operational amplifier included in the sample and hold circuit of FIG. 1.

The operational amplifier 190 is basically a differential amplifier and has the arrangement shown in FIG. 2. As shown, one terminal of an n-channel MOS transistor N57 is connected to the ground, and a voltage Vb is applied to the gate of the transistor N57. Each one terminal of p-channel MOS transistors P51, P52 is connected to the power supply VDD and each gate of the transistors P51, P52 is connected to the other terminal of the transistor P51.

Each one terminal of n-channel MOS transistors N56, N53 is connected to the other terminal of the transistor N57. The other terminals of the transistors N56, N53 are connected to the other terminal of the transistor P51 through the MOS transistors N55, N51, respectively. The gates of the transistors N56, N53 are connected to the non-inverting input terminals 190a and 190b of the operational amplifier 190, respectively. S3 and S4 denote control signals which are applied to the gates of the transistors N55 and N51 respectively. An n-channel MOS transistor N54 whose gate is connected to the inverting input terminal 190d is connected between the other terminal of the transistor P52 through the n-channel MOS transistor N52 and the other terminal of the transistor N57. A contact of the transistors N52 and P52 is connected to the output terminal 190c of the operational amplifier 190. The gate of the transistor N52 is connected to the power supply VDD.

Figure 3:
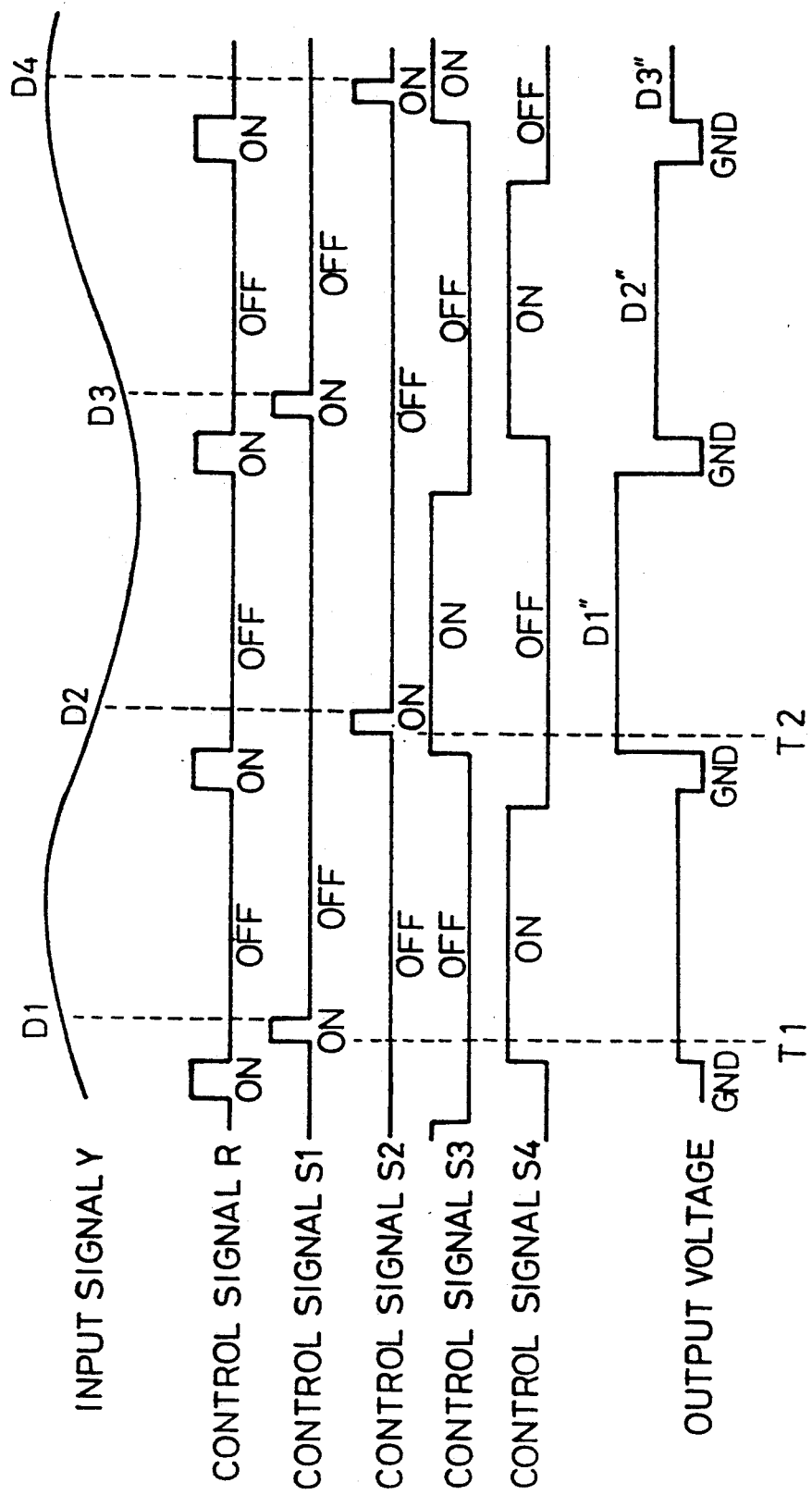
FIG. 3 is a timing chart for explaining the function of the sample-and-hold circuit of FIG. 1.

When the input signal Y is sampled and held at predetermined periods, the sample-and-hold circuit arranged as described above functions as follows in response to the control signals R and S1 to S4 shown in the timing chart of FIG. 3.

The high level control signals S1 and S2 are alternately inputted to the analog switches 12 and 16 at predetermined periods so that switches 12, 16 are switched on alternately. That is to say, when the high level control signal S1 is inputted to the analog switch 12 at the timing point T1, the analog switch 12 is switched on so that the signal Y is applied to the capacitor 13. When the control signal S1 falls to the low level, the analog switch 12 is switched off so that the capacitor 13 can hold the voltage D1 of the signal Y immediately before the fall. The voltage D1 is inputted to the non-inverting input terminal 190a of the operational amplifier 190. Then, when the control signal S3 rises to the high level, the transistor N55 is switched on so that the transistor N56 is connected between the transistors N57 and P51. This results in allowing the circuit of FIG. 2 to function as a differential amplifier for amplifying a voltage difference between the input terminals 190a and 190d.

When the high level control signal S2 is inputted to the analog switch 16 at the timing point T2, the analog switch 16 is switched on so that the signal Y is applied to the capacitor 17. When the control signal S2 falls to the low level, the analog switch 16 is switched off so that the capacitor 17 holds the voltage D2 of the signal Y immediately before the fall. The voltage D2 is inputted to the non-inverting input terminal 190b of the operational amplifier 190. When the control signal S4 rises to the high level, the transistor N51 is switched on so that the transistor N53 is connected between the transistors N57 and P51. This results in allowing the circuit shown in FIG. 2 to function as a differential amplifier for amplifying a voltage difference between the input terminals 190b and 190d. Thereafter, each time the high level control signals S1, S2,. are inputted, the voltage (D3, D4, . . . ) of the signal Y is sampled and held in the capacitors 13, 17 and then it is outputted to the outside through the buffer.

The transistor 22 becomes on when the high level control signal R is supplied to its gate while the control signals S3 and S4 are at the low level. The on-state transistor 22 causes the output of the buffer 20 to be short-circuited to the ground. The output voltage of the buffer is kept at the ground level during a certain period when the voltage to be amplified is switched from the voltage held in the capacitor 13 to the voltage held in the capacitor 17 or from the voltage held in the capacitor 17 to the voltage held in the capacitor 13.

Figure 4:
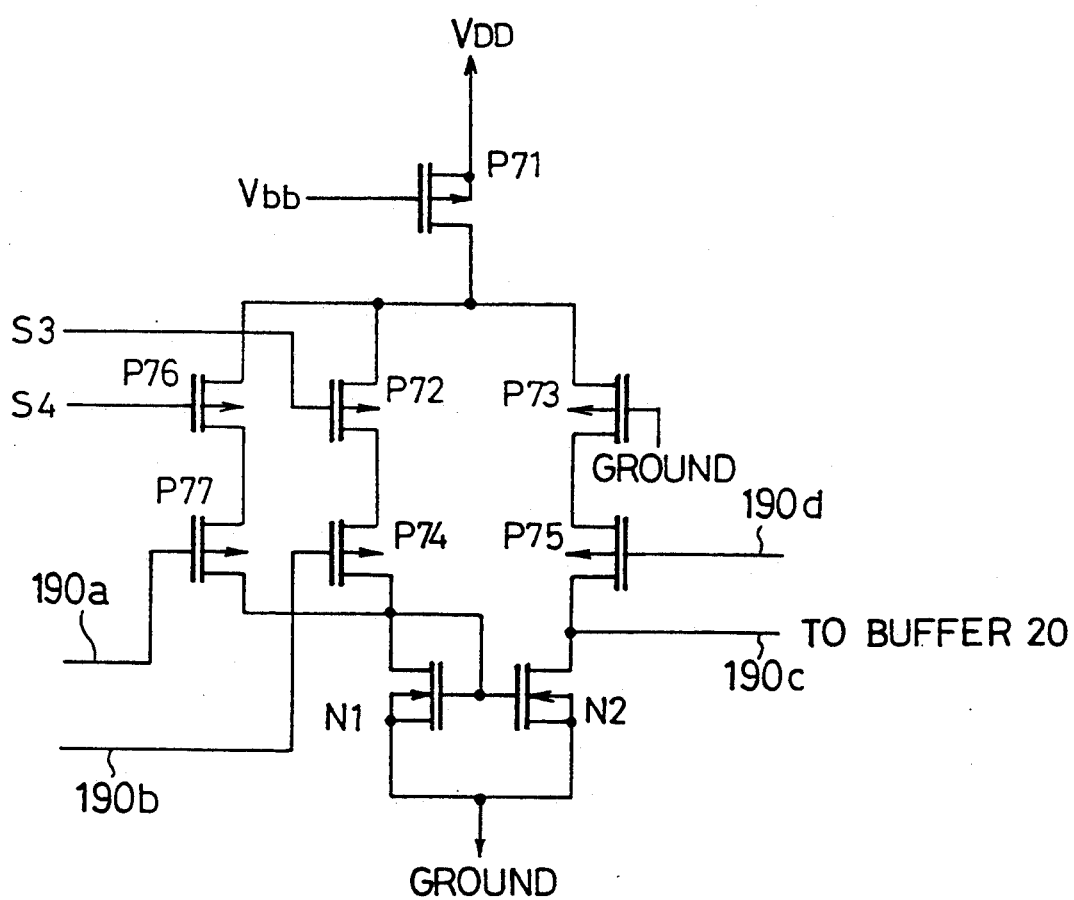
FIG. 4 is a circuit diagram showing another arrangement of an operational amplifier of the sample-and-hold circuit of FIG. 1.

In the foregoing embodiment, the constant current circuit included in the differential amplifier of the operational amplifier 190 is composed of an n-channel MOS transistor. However, the p-channel MOS transistor may be used for the constant current circuit. FIG. 4 shows the circuit diagram of the operational amplifier in that case. One terminal of a p-channel MOS transistor P71 constituting the constant current circuit is connected to the power supply VDD. The gate of the p-channel MOS transistor P71 receives a voltage Vbb. Each one terminal of n-channel MOS transistors N1, N2 is connected to the ground and each gate of the transistors N1, N2 is connected to the other terminal of the transistor N1.

Each one terminal of p-channel MOS transistors P77, P74 is connected to the other terminal of the transistor N1. The other terminal of the transistors P77, P74 are connected to the other terminal of the transistor P71 through p-channel MOS transistors P76, P72 respectively which function as analog switches. The gates of the transistors P77, P74 are connected to the non-inverting input terminals 190a, 190b of the operational amplifier 190. The gates of the transistors P76 and P72 receive the control signals S4 and S3 respectively. A p-channel MOS transistor P75 whose gate is connected to the inverting input terminal 190d of the operational amplifier 190 is connected between the other terminal of the transistor P71 through a p-channel MOS transistor P73 and the other terminal of the transistor N2. The contact between the transistors P75 and N2 is connected to the output terminal 190c of the operational amplifier 190. The gate of the transistor P73 is connected to the ground.

The operational amplifier arranged as described above similarly functions as the operational amplifier 190 shown in FIG. 2. Hence, the operational amplifier 190 shown in FIG. 1 may be replaced with this operational amplifier.

Many widely different embodiments of the present invention may be constructed without departing from the spirit and scope of the present invention. It should be understood that the present invention is not limited to the specific embodiments described in this specification, except as defined in the appended claims.

What is claimed is:

1. A sample-and-hold circuit comprising:
   two capacitors, coupled to an input signal line through respective analog switches, for holding an input signal voltage; and
   a differential amplifier circuit, having two non-inverting input terminals for respectively receiving voltages held in said two capacitors and having one inverting input terminal to which an output of said differential amplifier is coupled through a buffer amplifier as a negative feedback signal, for amplifying said received voltages,
   said differential amplifier circuit alternately amplifying said voltages received through said two non-inverting input terminals.

2. The sample-and-hold circuit as claimed in claim 1, wherein said differential amplifier circuit comprises MOS transistors.

3. The sample-and-hold circuit as claimed in claim 1, wherein said differential amplifier circuit comprises:
   a current mirror circuit; and
   an amplifier circuit, coupled to said current mirror circuit, having
      two transistors, each receiving a non-inverting input from a respective one of said two non-inverting input terminals, and
      switching means for selecting one of said two transistors in accordance with control signals.

4. The sample-and-hold circuit as claimed in claim 1, wherein said differential amplifier circuit comprises:
   a current mirror circuit including
      a first transistor having a drain terminal connected to an output terminal of said differential amplifier circuit, and
      a second transistor having a drain terminal connected to gates of said first and second transistors; and an amplifier circuit including
      third and fourth transistors, each having a source terminal connected to said drain terminal of said second transistor and a gate terminal connected to a respective switching signal,
      fifth and sixth transistors, each having a source terminal connected to a drain terminal of a respective one of said third and fourth transistors and a gate terminal connected to a respective one of said two non-inverting input terminals,
      a seventh transistor having a source terminal connected to said drain terminal of said first transistor and a gate terminal connected to a voltage supply, and
      an eighth transistor having a source terminal connected to a drain terminal of said seventh transistor and a gate terminal connected to said inverting input terminal.

5. A sample-and-hold circuit comprising:
   two capacitors, coupled to an input signal line through respective analog switches, for holding an input signal voltage; and
   an amplifier circuit having two non-inverting input terminals for respectively receiving voltages held in said two capacitors and for amplifying said received voltages,
   said amplifier circuit alternately amplifying said voltages received through said two non-inverting input terminals.

6. The sample-and-hold circuit as claimed in claim 5, wherein said amplifier circuit is a differential amplifier having said two non-inverting input terminals and one inverting input terminal to which an output of said amplifier circuit is applied as a negative feedback signal.

7. The sample-and-hold circuit as claimed in claim 6, wherein said differential amplifier is comprised of MOS transistors.

8. The sample-and-hold circuit as claimed in claim 5, wherein said amplifier circuit is a differential amplifier circuit comprising:
   a current mirror circuit; and
   an amplifying circuit, coupled to said current mirror circuit, having
      two transistors, each receiving a non-inverting input from a respective one of said two non-inverting input terminals, and
      switching means for selecting one of said two transistors in accordance with control signals.

9. A sample-and-hold circuit as claimed in claim 5, wherein said amplifier circuit is a differential amplifier circuit comprising:
   a current mirror circuit including
      a first transistor having a drain terminal connected to an output terminal of said differential amplifier circuit, and
      a second transistor having a drain terminal connected to gates of said first and second transistors; and an amplifying circuit including
   third and fourth transistors, each having a source terminal connected to said drain terminal of said second transistor and a gate terminal connected to a respective switching signal,
   fifth and sixth transistors, each having a source terminal connected to a drain terminal of a respective one of said third and fourth transistors and a gate terminal connected to a respective one of said two non-inverting input terminals,
   a seventh transistor having a source terminal connected to said drain terminal of said first transistor and a gate terminal connected to a voltage supply, and
   an eighth transistor having a source terminal connected to a drain terminal of said seventh transistor and a gate terminal connected to an inverting input terminal of said differential amplifier circuit.

* * * * *